(12) United States Patent
Ito et al.

(10) Patent No.: US 8,703,580 B2
(45) Date of Patent: Apr. 22, 2014

(54) SILICON ON INSULATOR (SOI) WAFER AND PROCESS FOR PRODUCING SAME

(75) Inventors: Atsuo Ito, Tokyo (JP); Yoshihiro Kubota, Tokyo (JP); Kiyoshi Mitani, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/163,764

(22) Filed: Jun. 27, 2008

(65) Prior Publication Data
US 2008/0305317 A1     Dec. 11, 2008

Related U.S. Application Data

(63) Continuation of application No. PCT/JP2006/313910, filed on Jul. 12, 2006.

(30) Foreign Application Priority Data

Dec. 27, 2005   (JP) ................................ 2005-374884

(51) Int. Cl.
   *H01L 21/30*      (2006.01)
   *H01L 21/46*      (2006.01)

(52) U.S. Cl.
   USPC .................................. 438/458; 257/E21.568

(58) Field of Classification Search
   USPC ................................................. 257/E21.568
   See application file for complete search history.

(56) References Cited

U.S. PATENT DOCUMENTS

| | | |
|---|---|---|
| 5,383,993 A | 1/1995 | Katada et al. |
| 6,153,524 A | 11/2000 | Henley et al. |
| 6,486,008 B1 | 11/2002 | Lee |
| 6,566,233 B2 * | 5/2003 | Yokokawa et al. ........... 438/455 |
| 6,613,678 B1 | 9/2003 | Sakaguchi et al. |
| 6,908,832 B2 * | 6/2005 | Farrens et al. ................ 438/455 |

(Continued)

FOREIGN PATENT DOCUMENTS

| | | |
|---|---|---|
| JP | 05-029183 A | 2/1993 |
| JP | 07-249749 A | 9/1995 |

(Continued)

OTHER PUBLICATIONS

PCT International Search Report PCT/JP2006/313910; Oct. 17, 2006.

Abe, et al. "Hariawase SOI Wafer no Kongo no Tenkai"; Oyo Butsuri; 1997; pp. 1220-1224; vol. 66, No. 11 (described in PCT International Search Report for PCT/JP/2006/313910 dated Oct. 17, 2006 as filed herein with IDS on Jun. 27, 2008 as "defines the general state of the art, not of particular relevance").

(Continued)

*Primary Examiner* — Daniel Luke
(74) *Attorney, Agent, or Firm* — William J. Kubida; Peter J. Meza; Hogan Lovells US LLP

(57) ABSTRACT

In a manufacturing method for manufacturing a silicon on insulator (SOI) wafer, an ion injection layer is formed within the wafer, by injecting a hydrogen ion or a rare gas ion from a surface of the single crystal silicon wafer, the ion injection surface of the single crystal silicon wafer and/or a surface of the transparent insulation substrate is processed using plasma and/or ozone, the ion injection surface of the single crystal silicon wafer is bonded to the surface of the transparent insulation substrate, by bringing them into close contact with each other at room temperature, with the processed surface(s) as bonding surface(s), and an SOI layer is formed on the transparent insulation substrate, by mechanically peeling the single crystal silicon wafer by giving an impact to the ion injection layer.

13 Claims, 1 Drawing Sheet

(56) References Cited

U.S. PATENT DOCUMENTS

| | | |
|---|---|---|
| 2003/0170990 A1 | 9/2003 | Sakaguchi et al. |
| 2004/0056332 A1 | 3/2004 | Bachrach |
| 2005/0148163 A1* | 7/2005 | Nguyen et al. ............... 438/514 |
| 2005/0269671 A1* | 12/2005 | Faure et al. ................... 257/618 |
| 2006/0076559 A1* | 4/2006 | Faure et al. ..................... 257/49 |
| 2010/0025804 A1 | 2/2010 | Kawai et al. |

FOREIGN PATENT DOCUMENTS

| | | |
|---|---|---|
| JP | H7249749 | 9/1995 |
| JP | 11-145438 | 5/1999 |
| WO | 99/06110 A1 | 2/1999 |

OTHER PUBLICATIONS

Korea Patent Application No. 10-2008-7017520, Korean Notice Requesting Submission of Opinion with English Translation, Dec. 14, 2009, pp. 1-3.

Extended European Search report for application No. 06781030.9-1528/1981064 PCT/JP2006313910, mailed Nov. 19, 2010, pp. 12.

Henttinen K. et al., "Mechanically induced Si layer transfer in hydrogen-implanted Si wafers", Applied Physics Letters, vol. 76, No. 17, Melville, NY, XP012025120, pp. 2370-2372.

* cited by examiner

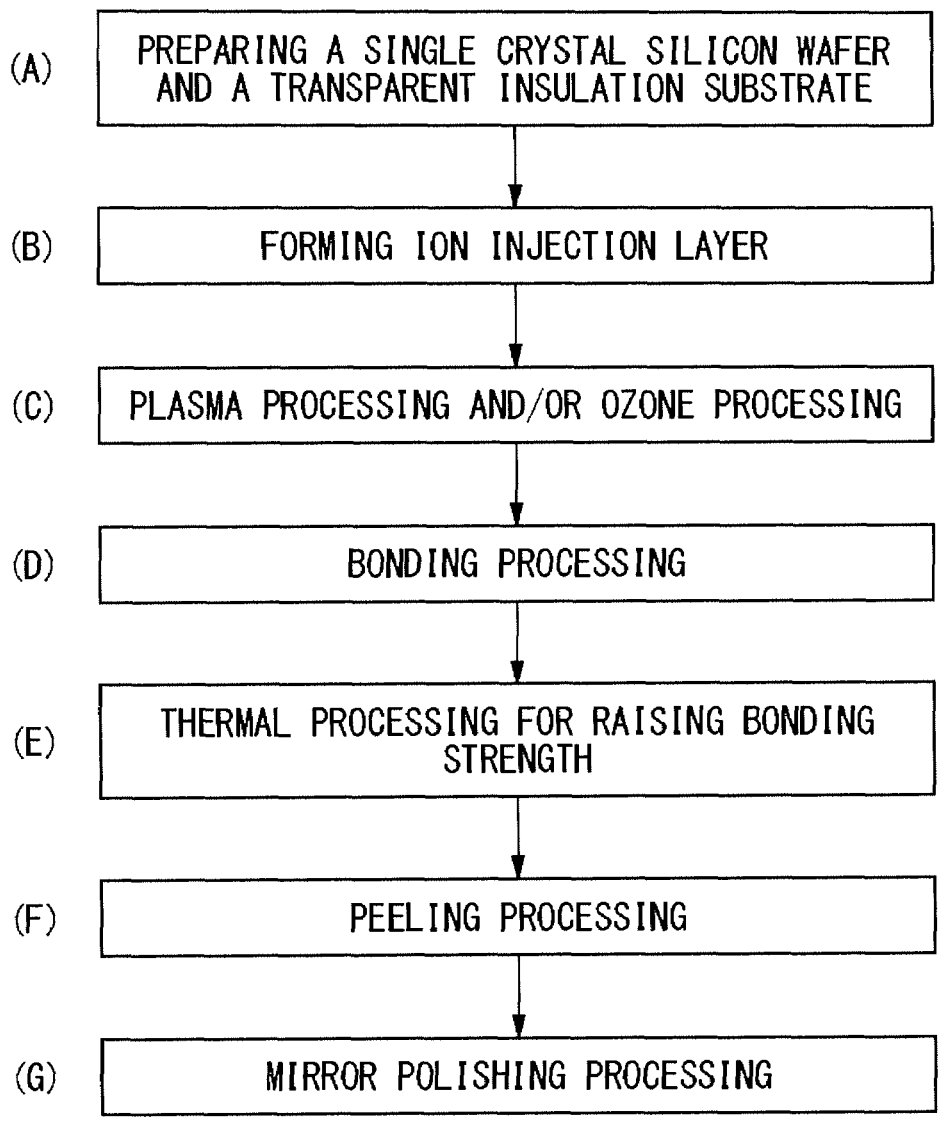

SILICON ON INSULATOR (SOI) WAFER AND PROCESS FOR PRODUCING SAME

CROSS REFERENCE TO RELATED APPLICATION

The present application is continuation application of PCT/JP2006/313910 filed on Jul. 12, 2006 which claims priority from Japanese Patent Application No. 2005-374884 filed on Dec. 27, 2005, the contents of both applications being incorporated herein by reference.

BACKGROUND

1. Technical Field

The present invention relates to a manufacturing method of an SOI wafer and to an SOI wafer. Particularly, the present invention relates to a manufacturing method of an SOI wafer in which an SOI layer is formed on a transparent insulation substrate, and to the SOI wafer.

2. Description of the Related Art

An SOI wafer including an SOI (silicon on insulator) structure in which a silicon single crystal layer is formed on an insulator is suited for fabricating a semiconductor integrated circuit of a high density, and is expected to be applied to optical devices such as "TFT-LCD" (thin film transistor-liquid crystal display).

An SOI wafer in which an SOI layer is formed on a transparent silica substrate is used as such an optical device, for example. In this case, the substrate is a complete insulator, and so does not affect the mobility of the carrier within the SOI layer. Consequently, the mobility of the carrier in the SOI layer will be extremely high, thereby yielding a noticeable effect particularly when driven in high frequency. In addition, in such an SOI wafer, a driving circuit can be formed in an integral manner in the periphery of the TFT region, which enables high density mounting.

In such an SOI wafer for use as an optical device, the thickness of the SOI layer should be as thin as about 0.5 µm, for example. Accordingly, the bonding strength between the silica substrate and the SOI layer should be sufficiently strong and firm to endure grinding, polishing for making the SOI layer to be as thin as the level of the stated thickness, and to withstand the thermal and mechanical stresses exercised onto the SOI layer in manufacturing the device. To enhance the bonding strength, it has been required to perform thermal processing under a high temperature.

However, the thermal expansion coefficient differs between a silica substrate and an SOI layer. This occasionally causes stress due to thermal deformation during the thermal processing for bonding, during the cooling processing after the bonding, or during the grinding or polishing processing, thereby causing the silica substrate or the SOI layer to crack, or to break due to flaking. Such a problem is not confined to a case where the insulation transparent substrate is made of silica, and may equally happen when bonding a single crystal silicon wafer to a substrate having a different thermal expansion coefficient.

So as to solve the mentioned problem, a technology has been disclosed for alleviating the effect of thermal stress incident to thermal processing, by performing a thermal bonding processing process and a thin film process alternately and step by step, in an SOI wafer manufacturing method adopting a hydrogen ion injection peeling method (e.g. Patent Document No. 1: Japanese Patent Application Publication No. 11-145438).

SUMMARY

Regarding a manufacturing method of an SOI wafer in which an SOI layer is formed on a transparent insulation substrate, it is an object of an aspect of the innovations herein to provide a manufacturing method of an SOI wafer and to provide an SOI wafer, by which thermal deformation, flaking, cracking, or the like attributable to the difference in thermal expansion coefficient between a transparent insulation substrate and an SOI layer is prevented with a simple process.

According to the first aspect related to the innovations herein, one exemplary manufacturing method is a manufacturing method for manufacturing an SOI wafer by bonding a single crystal silicon wafer to a transparent insulation substrate, and thereafter making the single crystal silicon wafer to be thinned to form an SOI layer on the transparent insulation substrate, the manufacturing method characterized in performing at least: a step of forming an ion injection layer within the single crystal silicon wafer, by injecting at least one of a hydrogen ion and a rare gas ion from a surface of the single crystal silicon wafer; a step of processing the ion injection surface of the single crystal silicon wafer and/or a surface of the transparent insulation substrate using plasma and/or ozone; a step of bonding the ion injection surface of the single crystal silicon wafer to the surface of the transparent insulation substrate, by bringing them into close contact with each other at room temperature, with the ion injection surface and the surface as bonding surfaces; and a step of forming an SOI layer on the transparent insulation substrate, by mechanically peeling the single crystal silicon wafer by giving an impact to the ion injection layer.

By processing the ion injection surface of the single crystal silicon wafer and/or the surface of the transparent insulation substrate using plasma and/or ozone, an OH group will be increased and activated on the injection surface of the wafer and/or a surface of the substrate. If the ion injection surface of the single crystal silicon wafer and the surface of the transparent insulation substrate, under such a state, are brought into close contact with each other in a room temperature to be bonded, with the processed surfaces as the bonding surfaces, the surfaces brought into close contact will be firmly bonded by means of hydrogen bonding, to obtain sufficiently firm bonding even without providing high temperature thermal processing for raising the bonding strength in later stages. In addition, since the bonding surfaces are firmly bonded to each other in the above way, thereafter a thin SOI layer can be formed on the transparent insulation substrate by mechanically peeling the single crystal silicon wafer by giving an impact to the ion injection layer. This means that a thin film can be obtained even without performing thermal processing for peeling. This further indicates that an SOI wafer can be manufactured without causing thermal deformation, flaking, cracking, or the like attributable to the difference in thermal expansion coefficient between the transparent insulation substrate and the single crystal silicon wafer. In addition, since the hydrogen ion injection peeling method is used, it is possible to manufacture an SOI wafer whose SOI layer has a thin film thickness, a favorable film thickness evenness, and excellent crystallization.

In this case, between the step of bonding and the step of forming an SOI layer, it is preferable to perform a step of raising a bonding strength by performing thermal processing to the bonded wafer under a temperature of 100-300 degrees centigrade. As in the above way, if the single crystal silicon wafer and the transparent insulation substrate bonded to each other are subjected to the mechanical peeling step for giving an impact to the ion injection layer, after raising the bonding strength by performing thermal processing of a low temperature of 100-300 degrees centigrade which does not cause thermal deformation, it is possible to manufacture an SOI wafer by more assuredly preventing the generation of flaking, cracking, or the like of the bonding surfaces attributable to the mechanical stress.

It is preferable that mirror polishing is provided to a surface of the SOI layer of the SOI wafer obtained in the step of forming an SOI layer.

In this way, by providing mirror polishing to a surface of the SOI layer of the SOI wafer obtained in the step of forming an SOI layer, it is possible to remove surface roughness of the SOI layer caused in the peeling process or to remove the crystal defects or the like caused in the ion injection process, thereby enabling to manufacture an SOI wafer having an SOI layer whose surface is mirror polished and smooth.

It is preferable that the transparent insulation substrate is one of a silica substrate, a sapphire (alumina) substrate, and a glass substrate.

As in the above way, if the transparent insulation substrate is one of a silica substrate, a sapphire (alumina) substrate, and a glass substrate, it is possible to manufacture an SOI wafer suitable for fabricating an optical device, since these substrates have a favorable optical characteristic. Here, examples of the glass substrate include highly clear opaque glass, borosilicate glass, alkali-free borosilicate glass, aluminoborosilicate glass, and crystallized glass, in addition to soda-lime glass in common use. When using a glass substrate that includes alkali metal (e.g. soda-lime glass), it is desirable that a surface of the glass substrate be provided with a diffusion protective film made of spin-on glass, for preventing diffusion of alkali metal from the surface.

Further, it is preferable that an ion injection dose used in the step of forming an ion injection layer is greater than $8 \times 10^{16}/cm^2$.

As in the above way, by setting the ion injection dose to be greater than $8 \times 10^{16}/cm^2$ in forming the ion injection layer, the mechanical peeling becomes easy.

In addition, provided according to the innovations herein is an SOI wafer manufactured according to any of the manufacturing methods recited above.

As in the above way, an SOI wafer manufactured according to any of the above-described manufacturing methods has not caused any thermal deformation, flaking, cracking, or the like during manufacturing, as well as having a thinner film thickness and a more favorable film thickness evenness, having excellent crystallization, and having an SOI layer on a transparent insulation substrate having high carrier mobility, useful for manufacturing various devices.

By adopting the manufacturing method of an SOI wafer according to the innovations herein, the surfaces to be bonded are processed with plasma and/or ozone prior to bonding of the single crystal silicon wafer and the transparent insulation substrate, which increase and activates the OH group on the surfaces. If the single crystal silicon wafer and the transparent insulation substrate, under such a state, are brought into close contact with each other in a room temperature to be bonded, the surfaces brought to close contact will be sufficiently firm bonding even without providing high temperature thermal processing for raising the bonding strength in later stages. In addition, since the bonding surfaces are firmly bonded to each other in the above way, thereafter a thin SOI layer can be formed on the transparent insulation substrate by mechanically peeling the single crystal silicon wafer by giving an impact to the ion injection layer. This means that a thin film can be obtained even without performing thermal processing for peeling. This further indicates that an SOI wafer can be manufactured without causing thermal deformation, flaking, cracking, or the like attributable to the difference in thermal expansion coefficient between the transparent insulation substrate and the single crystal silicon.

In addition, the SOI wafer according to the present invention is an SOI wafer that does not cause thermal deformation, flaking, cracking, or the like during manufacturing, has a thinner film thickness, a more favorable evenness in film thickness, excellent crystallization, and an SOI layer on a transparent insulation substrate having high carrier mobility, useful for manufacturing various devices.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 1 is a process diagram showing one example of a manufacturing method of an SOI wafer, according to the present invention.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

As mentioned above, regarding a manufacturing method of an SOI wafer in which an SOI layer is formed on a transparent insulation substrate, so as to prevent thermal deformation, flaking, cracking, or the like attributable to the difference in thermal expansion coefficient between a transparent insulation substrate and an SOI layer, a technology has been already disclosed by which the effect of the thermal stress incident to thermal processing is alleviated by performing a thermal bonding processing process and a thin film process alternately and step by step, in an SOI wafer manufacturing method adopting a hydrogen ion injection peeling method. However for the purpose of improving the productivity of the SOI wafer, a new technology has been nevertheless desired for solving the stated problem by a smaller number of processes and in a short time.

In view of this, the inventors of the present invention have conceived to enhance the bonding strength without performing the thermal processing by preprocessing the surfaces to be bonded using plasma and/or ozone processing, and to perform peeling mechanically instead of thermal processing, thereby completing the present invention. As follows, some aspects of the present invention are described by way of embodiments. The present invention will not be limited to the following embodiments.

FIG. 1 is a process diagram showing one example of a manufacturing method of an SOI wafer, according to the present invention.

First, a single crystal silicon wafer and a transparent insulation substrate are prepared (process A).

The single crystal silicon wafer is not particularly limited as long as it is obtained by slicing a single crystal grown by the Czochralski method for example, which for example has a diameter of 100-300 mm, a conductivity type of P-type or N-type, and a resistivity of about 10 Ω·cm.

The transparent insulation substrate is not also particularly limited. However if any of a silica substrate, a sapphire (alumina) substrate, and a glass substrate, all of them having a favorable optical characteristic, is used as a transparent insulation substrate, it is possible to manufacture an SOI wafer suitable for fabricating an optical device.

Next, at least one of a hydrogen ion and a rare gas ion is injected from the surface of the single crystal silicon wafer, to form an ion injection layer in the wafer (process B).

For example, at least one of a hydrogen ion and a rare gas ion in a predetermined dose is injected from the surface of the single crystal silicon wafer, with an injection energy capable of forming an ion injection layer at the depth corresponding to a predetermined SOI layer thickness (e.g. the depth of smaller than or equal to 0.5 µm), while keeping the temperature of the single crystal silicon wafer to 250-450 degrees centigrade. An exemplary condition may be the injection energy of 20-100 keV and the injection dose of $1\times10^{16}$-$1\times10^{17}$/cm2. Here, so as to facilitate the peeling at the ion injection layer, the ion injection dose should preferably be equal to or greater than $8\times10^{16}$/cm2. In addition, if the ion injection is performed through an insulation film such as a thin silicon oxide layer formed in advance on a surface of the single crystal silicon wafer, an advantage of restraining channeling of the injected ion will be obtained.

Next, the ion injection surface of this single crystal silicon wafer and/or the surface of the transparent insulation substrate are/is processed with plasma and/or ozone (process C).

In adopting plasma processing, a single crystal silicon wafer and/or a transparent insulation substrate, to which cleansing such as RCA cleansing has been performed, are/is placed in a vacuum chamber, and a gas for plasma processing (hereinafter simply "plasma gas") is introduced. Then the single crystal silicon wafer and/or the transparent insulation substrate are/is subjected to high frequency plasma of about 100 W for about 5-10 seconds, to perform plasma processing to the surface thereof. In processing a single crystal silicon wafer, for oxidizing the surface thereof, the plasma gas may be plasma of an oxygen gas. For not oxidizing the surface of a single crystal silicon wafer, the plasma gas may be a hydrogen gas, an argon gas, a mixture gas of them, or a mixture gas of a hydrogen gas and a helium gas. Any gas is usable for processing of a transparent insulation substrate.

In adopting ozone processing, a single crystal silicon wafer and/or a transparent insulation substrate, to which cleansing such as RCA cleansing has been performed, are/is placed in a chamber to which atmospheric air is introduced, and a plasma gas such as a nitrogen gas, an argon gas, or the like is introduced. Then the surfaces are treated with ozone processing by generating high frequency plasma to convert the oxygen in the atmospheric air into ozone. Here, it is possible to perform any one of plasma processing and ozone processing, or it is also possible to perform both of plasma processing and ozone processing.

By processing with plasma and/or ozone, the organic substances on the surface of the single crystal silicon wafer and/or the transparent insulation substrate are oxidized to be removed, and instead the OH group on the surface is increased and activated. The surface to be processed may be a bonding surface. For a single crystal silicon wafer, the surface to be processed is an ion injection surface. The processing is desirably performed to both of a single crystal silicon wafer and a transparent insulation substrate. However the processing may be performed to only one of the single crystal silicon wafer and the transparent insulation substrate.

Then, the ion injection surface of the single crystal silicon wafer and the surface of the transparent insulation substrate, to which plasma processing and/or ozone processing are/is provided, are brought into close contact with each other in a room temperature to be bonded, with the ion injection surface and the surface as the bonding surfaces (process D).

In the process C, at least one of the ion injection surface of the single crystal silicon wafer and the surface of the transparent insulation substrate is processed by plasma processing and/or ozone processing. Consequently, the respective surfaces of the single crystal silicon wafer and of the transparent insulation substrate are able to be bonded to each other firmly, with a strength that can endure the mechanical peeling in the later processes, by simply bringing them into close contact with each other, under a reduced pressure or a normal pressure, and in a temperature of about a general room temperature, for example. This means that thermal bonding processing of equal to or more than 1200° C. is not necessary, and so it is preferable since there is no possibility of causing thermal deformation, flaking, cracking, or the like attributable to the difference in thermal expansion coefficient, which is a problem inherent in heating processes.

After this, the bonded wafer may be subjected to thermal processing of a low temperature of 100-300° C., for enhancing the bonding strength (process E).

For example, when the transparent insulation substrate is made of silica, the thermal expansion coefficient is smaller than that of silicon (i.e. Si: $2.33\times10^{-6}$, and silica: $0.6\times10-6$). Therefore if the silica transparent insulation substrate is heated after being bonded to the silicon wafer having about the same thickness, the silicon wafer will break when exceeding 300 degrees centigrade. Thermal processing of a relatively low temperature as in this process E is desirable since it does not have a possibility of causing thermal deformation, flaking, cracking, or the like attributable to the difference in thermal expansion coefficient. Note that in adopting a thermal processing furnace (i.e. a batch processing type), a sufficient advantage is obtained if the thermal processing time is about 0.5-24 hours.

Next, a single crystal silicon wafer is mechanically peeled by giving an impact to the ion injection layer, to form an SOI layer on the transparent insulation substrate (process F).

In the hydrogen ion injection peeling method, thermal processing is performed to the bonded wafer in an inert gas atmosphere of about 500° C., to perform thermal peeling by means of a rearrangement effect of crystal and an aggregating effect of air bubbles of injected hydrogen. In contrast, the present invention performs mechanical peeling by giving an impact to an ion injection layer, and so there is no possibility of causing thermal deformation, flaking, cracking, or the like that would happen incident to heating.

For giving an impact to the ion injection layer, a jet may be used to blow a fluid such as gas, liquid, or the like continuously or discontinuously from the side surface of the bonded wafer, for example. However, another method may be adopted as long as the method causes mechanical peeling by impact.

In the above way, an SOI wafer in which an SOI layer is formed on a transparent insulation substrate is formed is obtained in the peeling process. It is preferable to provide mirror polishing to a surface of the SOI layer of the SOI wafer obtained in this way (process G). This mirror polishing enables to remove surface roughness caused in the peeling process (so-called "haze"), and to remove the crystal defects caused in the vicinity of the SOI layer surface due to the ion injection. An example of this mirror polishing is "touch polish" that removes an extremely small thickness of 5-400 nm.

The SOI wafer produced by the processes of A-G has not caused any thermal deformation, flaking, cracking, or the like, during manufacturing, as well as having a thin film thickness, a favorable film thickness evenness, excellent crystallization, and an SOI layer on a transparent insulation substrate having high carrier mobility, useful for manufacturing various devices.

Moreover, such an SOI wafer is particularly suited for fabrication of an optical device such as a TFT-LCD, because of having an SOI layer on the transparent insulation substrate.

Embodiment Example

A single crystal silicon wafer having a diameter of 200 mm and one surface thereof being subjected to mirror polishing is prepared, as a wafer for forming an SOI layer. A silicon oxide layer of 100 nm is formed on the surface of the single crystal silicon wafer by thermal oxidization. The surface roughness (Ra) of the oxide layer at the surface subjected to mirror polishing (i.e. a surface to be bonded) was 0.2 nm. The measurement was performed to the measurement region of 10 $\mu m \times 10$ $\mu m$ using an atom force microscope.

As a transparent insulation substrate, a synthetic silica wafer having a diameter of 200 mm and one surface thereof being subjected to mirror polishing is prepared. The surface roughness (Ra) of the transparent insulation substrate at the surface subjected to mirror polishing (i.e. a surface to be bonded) was 0.19 nm. The apparatus and the method of measuring have the same condition as the oxide layer of the single crystal silicon wafer.

A hydrogen ion is selected as the ion to be injected to a single crystal silicon wafer through the silicon oxide layer of 100 nm, and the ion is injected under a condition of an injection energy of 35 keV and an injection dose of $9 \times 10^{16}/cm^2$. The injection depth of the single crystal silicon layer was 0.3 nm.

Next, the single crystal silicon wafer to which ion has been injected is placed in a plasma processing apparatus, and an air is introduced as a plasma gas. Then the high frequency plasma processing is performed for 5-10 seconds by applying a high frequency of 13.56 MHz under a reduced pressure condition of 2 Torr between parallel plate electrodes having a diameter of 300 mm under a high frequency power of 50 W.

As for a synthetic silica wafer, the wafer is placed in a chamber to which an atmospheric air is introduced, and an argon gas is introduced as a plasma gas in narrow space between electrodes. Then by applying a high frequency between the electrodes to generate plasma, the oxygen in the atmospheric air becomes ozonized by the existence of the atmospheric air between the plasma and the substrate. The surface to be bonded is processed by means of the ozone. The processing time was set to 5-10 seconds.

The wafers to which surface processing was performed in the above manner were brought into close contact at room temperature, to start bonding by strongly pressing one end of the both wafers in the thickness direction. Then after 48 hours in the room temperature, the bonding surface was observed by human eyes. As a result, the bonding was confirmed to extend throughout the substrate.

So as to confirm the bonding strength, one of the wafers is fixed, and the wafer surface of the other wafer is provided with a stress in the parallel direction, in an attempt to perform displacement in the lateral direction, however the displacement did not occur.

Next, so as to peel the ion injection layer by giving an impact thereto, blades of paper cutting scissors were placed at the side surface of the bonded wafers in a diagonal position, thereby knocking in wedges several times. Accordingly, the peeling was caused at the ion injection layer, thereby obtaining an SOI wafer and a remaining single crystal silicon wafer.

The SOI layer surface (peeling surface) was observed by human eyes. As a result, the surface roughness was confirmed to be rougher than the surface roughness of the attached surfaces (Ra=0.2 nm). Therefore polishing is performed to remove the thickness of 100 nm, thereby obtaining a smooth surface having surface roughness (Ra) of smaller than or equal to 0.2 nm. The inside-surface film thickness evenness of this SOI layer was also measured. As a result, favorable film thickness evenness was confirmed, with the film thickness variation being restrained to equal to or smaller than 10 nm within the wafer surface. Furthermore, the crystallization of the SOI layer was evaluated by a SECCO defect evaluation using a liquid resulting from diluting the SECCO etching liquid according to a predetermined method. The confirmed defect density was $2 \times 10^3 - 6 \times 10^3/cm^2$ which is a favorable value.

The above-described embodiments do not limit the invention. The above-described embodiments are only illustrative, and includes a configuration substantially the same as the technical concept recited in the claims of the invention. Any configuration that has the same effects or advantages is intended to be included in the technical concept of the present invention.

For example, the SOI layer of the SOI wafer already subjected to the processes A-F (or A-G) is already sufficiently thinned. Therefore the high temperature thermal processing (at the temperature in the range between equal to or greater than 500° C., and smaller than the melting point of silicon) for further raising the bonding strength may be optionally performed depending on purposes.

What is claimed is:

1. A manufacturing method for manufacturing a silicon on insulator (SOI) wafer by bonding a single crystal silicon wafer to a transparent insulation substrate, and thereafter making the single crystal silicon wafer to be thinned to form an SOI layer on the transparent insulation substrate, the manufacturing method comprising:

forming an ion injection layer within the single crystal silicon wafer, by injecting at least one of a hydrogen ion and a rare gas ion from a surface of the single crystal silicon wafer;

placing the single crystal silicon wafer and/or the transparent insulation substrate in a chamber to which atmospheric air is introduced;

introducing a plasma gas in the chamber;

generating high frequency plasma to convert the oxygen in the atmospheric air into ozone, so as to process a surface of the single crystal silicon wafer and/or a surface of the transparent insulation substrate with ozone;

bonding the ion injection surface of the single crystal silicon wafer to a surface of the transparent insulation substrate, by bringing them into close contact with each other at room temperature, with the processed surface(s) as bonding surface(s);

raising a bonding strength by performing thermal processing to the bonded wafer under a temperature of 100-300° C.; and forming an SOI layer on the transparent insulation substrate, by mechanically peeling the single crystal silicon wafer by giving an impact to the ion injection layer.

2. The manufacturing method as set forth in claim 1, wherein mirror polishing is provided to a surface of the SOI layer of the SOI wafer obtained in the forming of an SOI layer.

3. An SOI wafer manufactured according to the manufacturing method as set forth in claim 1.

4. The manufacturing method as set forth in claim 1, further comprising forming an insulation film on a surface of the single crystal silicon wafer in advance, prior to the forming of an ion injection layer.

5. The manufacturing method as set forth in claim 1, further comprising providing mirror polishing to a surface of the SOI layer, after the forming of an SOI layer.

6. The manufacturing method as set forth in claim 1, wherein the giving the impact to the ion injection layer comprises blowing a jet of gas or liquid continuously or discontinuously.

7. The manufacturing method as set forth in claim 1, wherein the transparent insulation substrate is one of a silica substrate, a sapphire (alumina) substrate, and a glass substrate.

8. The manufacturing method as set forth in claim 7 wherein the transparent insulation substrate is a glass substrate having a surface provided with a diffusion protective film made of spin-on glass.

9. The manufacturing method as set forth in claim 1, wherein an ion injection dose used in the forming of the ion injection layer is greater than $8 \times 10^{16}/cm^2$.

10. The manufacturing method as set forth in claim 9, wherein the ion injection dose is less than $1 \times 10^{17}/cm^2$.

11. The manufacturing method as set forth in claim 1, further comprising:
    placing the single crystal silicon wafer and/or the transparent insulation substrate in a vacuum chamber;
    introducing a plasma gas in the vacuum chamber; and
    subjecting the single crystal silicon wafer and/or the transparent insulation substrate to high frequency plasma of about 100 W for about 5-10 seconds, so as to process a surface of the single crystal silicon wafer and/or a surface of the transparent insulation substrate with plasma.

12. The manufacturing method as set forth in claim 11, wherein the surface of the transparent insulation substrate is processed with the ozone and the surface of the single crystal silicon wafer is processed with the plasma.

13. The manufacturing method as set forth in claim 1, wherein the giving the impact to the ion injection layer comprises knocking the wafers with a solid object.

* * * * *

UNITED STATES PATENT AND TRADEMARK OFFICE
CERTIFICATE OF CORRECTION

PATENT NO. : 8,703,580 B2  
APPLICATION NO. : 12/163764  
DATED : April 22, 2014  
INVENTOR(S) : Atsuo et al.

Page 1 of 1

It is certified that error appears in the above-identified patent and that said Letters Patent is hereby corrected as shown below:

In the Claims

Column 8, line 59, "C." should be --C--

Signed and Sealed this
Twelfth Day of August, 2014

Michelle K. Lee
*Deputy Director of the United States Patent and Trademark Office*